US010468554B2

(12) United States Patent
Han et al.

(10) Patent No.: US 10,468,554 B2
(45) Date of Patent: Nov. 5, 2019

(54) LIGHT-EMITTING DEVICE HAVING A PLURALITY OF SUPPORT LAYERS AND LIGHT-EMITTING DEVICE PACKAGE INCLUDING THE SAME

(71) Applicant: LG INNOTEK CO., LTD., Seoul (KR)

(72) Inventors: Young Ju Han, Seoul (KR); Jina Gu, Seoul (KR); Hyun Gu Im, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/740,167

(22) PCT Filed: Jun. 17, 2016

(86) PCT No.: PCT/KR2016/006457
§ 371 (c)(1),
(2) Date: Dec. 27, 2017

(87) PCT Pub. No.: WO2017/003115
PCT Pub. Date: Jan. 5, 2017

(65) Prior Publication Data
US 2018/0190867 A1    Jul. 5, 2018

(30) Foreign Application Priority Data
Jun. 30, 2015  (KR) .................. 10-2015-0093322

(51) Int. Cl.
*H01L 33/36* (2010.01)
*H01L 33/52* (2010.01)
(Continued)

(52) U.S. Cl.
CPC .............. *H01L 33/36* (2013.01); *H01L 33/52* (2013.01); *H01L 33/64* (2013.01); *H01L 33/62* (2013.01); *H01L 2224/16245* (2013.01)

(58) Field of Classification Search
None
See application file for complete search history.

(56) References Cited

U.S. PATENT DOCUMENTS 7,141,825 B2 * 11/2006 Horio ..................... H01L 33/40
257/79
7,166,483 B2 *  1/2007 Liu ....................... H01L 33/38
257/E33.068
(Continued)

FOREIGN PATENT DOCUMENTS

CN    102800775    11/2012
JP    2010-186829   8/2010
(Continued)

OTHER PUBLICATIONS

International Search Report (with English Translation) and Written Opinion dated Sep. 9, 2016 issued in Application No. PCT/KR2016/006457.
(Continued)

Primary Examiner — Bilkis Jahan
(74) Attorney, Agent, or Firm — KED & Associates LLP

(57) ABSTRACT

A light-emitting device according to an embodiment of the present invention includes a substrate; a light-emitting structure provided on the substrate, and including a first conductive type semiconductor layer, a second conductive type semiconductor layer, and an active layer provided between the first conductive type semiconductor layer and the second conductive type semiconductor layer; a first electrode provided on the light-emitting structure; a first connecting electrode provided on the first electrode; a second electrode provided on the light-emitting structure; a second connecting electrode provided on the second electrode; and a support layer provided around the first electrode, the first connecting electrode, the second electrode and the second connecting electrode. The support layer includes a first support layer having a first coefficient of thermal expansion, and a second support layer provided on the first support layer and having a second coefficient of thermal expansion.

19 Claims, 13 Drawing Sheets

(51) Int. Cl.
*H01L 33/64* (2010.01)
*H01L 33/62* (2010.01)

(56) References Cited

U.S. PATENT DOCUMENTS

| | | | | |
|---|---|---|---|---|
| 2011/0193191 A1* | 8/2011 | Bito | ............ | H01L 27/0288 |
| | | | | 257/513 |
| 2011/0284822 A1* | 11/2011 | Jung | ............ | H01L 33/505 |
| | | | | 257/13 |
| 2011/0297987 A1* | 12/2011 | Koizumi | ............ | H01L 33/44 |
| | | | | 257/98 |
| 2012/0299038 A1* | 11/2012 | Hwang | ............ | H01L 33/385 |
| | | | | 257/98 |
| 2013/0119424 A1* | 5/2013 | Kang | ............ | H01L 33/20 |
| | | | | 257/98 |
| 2014/0141552 A1 | 5/2014 | Zou et al. | | |
| 2014/0246648 A1 | 9/2014 | Im et al. | | |

FOREIGN PATENT DOCUMENTS

| | | |
|---|---|---|
| KR | 10-2014-0061797 | 5/2014 |
| KR | 10-2014-0091245 | 7/2014 |
| KR | 10-2014-0123720 | 10/2014 |

OTHER PUBLICATIONS

Chinese Office Action dated Aug. 1, 2019 issued in Application CN 201680038459.8.

* cited by examiner

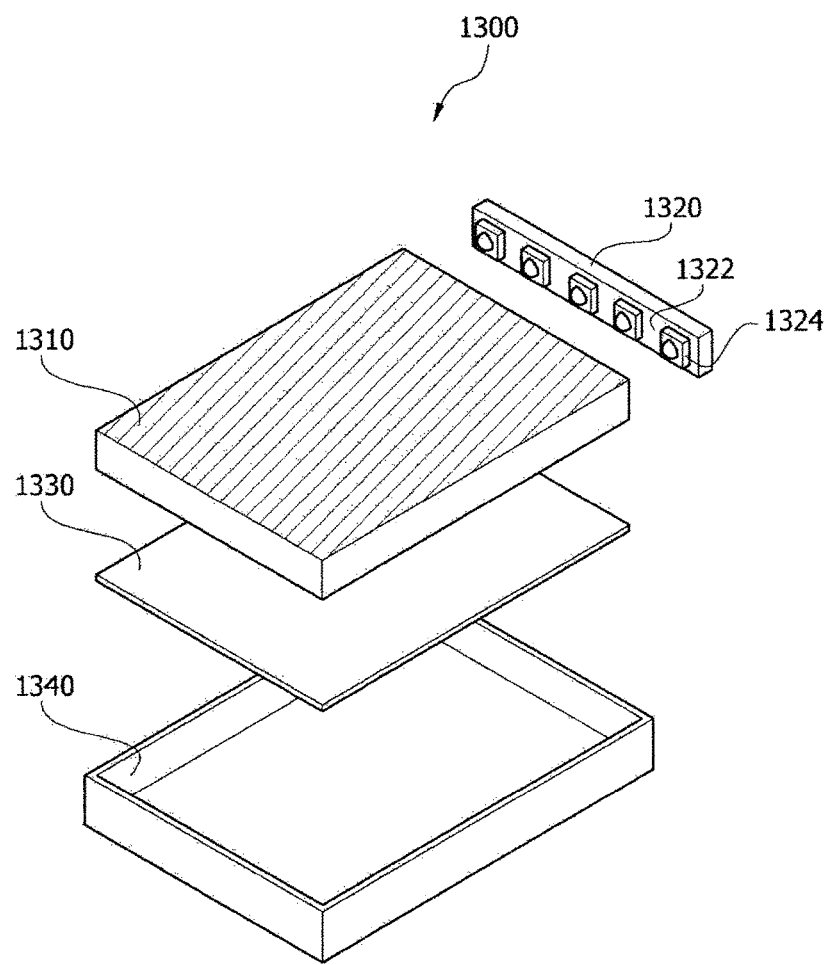

LIGHT-EMITTING DEVICE HAVING A PLURALITY OF SUPPORT LAYERS AND LIGHT-EMITTING DEVICE PACKAGE INCLUDING THE SAME

CROSS-REFERENCE TO RELATED PATENT APPLICATIONS

This application is a U.S. National Stage Application under 35 U.S.C. § 371 of PCT Application No. PCT/KR2016/006457, filed Jun. 17, 2016, which claims priority to Korean Patent Application No. 10-2015-0093322, filed Jun. 30, 2015, whose entire disclosures are hereby incorporated by reference.

TECHNICAL FIELD

The present invention relates to a light-emitting device and a light-emitting device package including the same

BACKGROUND ART

A light-emitting diode (LED) is a type of semiconductor device which transmits or receives signals by converting electric current into light using characteristics of a compound semiconductor or which is used as a light source. Such a light-emitting device has been widely used as a light source for various electronic devices such as display devices, electronic signs, and illumination devices.

With the advancement of light-emitting device technology, light-emitting device packages have been developed to become smaller, thinner, and highly efficient.

A light-emitting device package includes a light-emitting device bonded onto a lead frame. The light-emitting device includes a light-emitting structure and an electrode, and further includes a support member covering the electrode. In this case, interfacial deadhesion may occur due to different coefficients of thermal expansion of the light-emitting structure, the support member, and the lead frame, thereby decreasing the reliability of the light-emitting device with respect to thermal shock.

DISCLOSURE

Technical Problem

The present invention is directed to a light-emitting device with increased reliability with respect to thermal shock and a light-emitting device package including the same.

Technical Solution

One aspect of the present invention provides a light-emitting device including a substrate; a light-emitting structure provided on the substrate, the light-emitting structure including a first conductive type semiconductor layer, a second conductive type semiconductor layer, and an active layer provided between the first conductive type semiconductor layer and the second conductive type semiconductor layer; a first electrode provided on the light-emitting structure; a first connecting electrode provided on the first electrode; a second electrode provided on the light-emitting structure; a second connecting electrode provided on the second electrode; and a support layer provided around the first electrode, the first connecting electrode, the second electrode and the second connecting electrode. The support layer includes a first support layer having a first coefficient of thermal expansion; and a second support layer provided on the first support layer and having a second coefficient of thermal expansion.

The second coefficient of thermal expansion may be greater than the first coefficient of thermal expansion.

A difference between the first coefficient of thermal expansion and the second coefficient of thermal expansion may be 0.1 to 10 ppm/° C.

A difference between a coefficient of thermal expansion of the substrate and the first coefficient of thermal expansion may be 0.1 to 5 ppm/° C.

A difference between the second coefficient of thermal expansion and a coefficient of thermal expansion of a lead frame bonded with the first connecting electrode and the second connecting electrode may be 0.1 to 5 ppm/° C.

The first support layer may be provided around at least one of an interface between the first electrode and the first connecting electrode and an interface between the second electrode and the second connecting electrode.

The first support layer may have a thickness larger than that of the second support layer.

At least some portions of a side surface of the first connecting electrode and a side surface of the second connecting electrode may be exposed.

The second support layer may be provided only in a region between the first connecting electrode and the second connecting electrode.

The second support layer may be spaced apart from the side surface of the first connecting electrode and the side surface of the second connecting electrode.

The support layer may further include a third support layer provided on the second support layer and having a third coefficient of thermal expansion.

The coefficient of thermal expansion may increase from the first coefficient of thermal expansion to the second coefficient of thermal expansion to the third coefficient of thermal expansion.

A difference between the first coefficient of thermal expansion and the second coefficient of thermal expansion may be 0.1 to 10 ppm/° C., and a difference between the second coefficient of thermal expansion and the third coefficient of thermal expansion may be 0.1 to 10 ppm/° C.

The support layer thickness may decrease from the first support layer to the second support layer to the third support layer.

Another aspect of the present invention provides a light-emitting device package including a lead frame, a light-emitting device mounted on the lead frame, and a molding member surrounding the light-emitting device. The light-emitting device includes a substrate; a light-emitting structure provided on the substrate, the light-emitting structure including a first conductive type semiconductor layer, a second conductive type semiconductor layer, and an active layer provided between the first conductive type semiconductor layer and the second conductive type semiconductor layer; a first electrode provided on the light-emitting structure; a first connecting electrode provided on the first electrode; a second electrode provided on the light-emitting structure; a second connecting electrode provided on the second electrode; and a support layer provided around the first electrode, the first connecting electrode, the second electrode, and the second connecting electrode. The support layer may include a first support layer having a first coefficient of thermal expansion, and a second support layer provided on the first support layer and having a second coefficient of thermal expansion.

Advantageous Effects

A light-emitting device package according to an embodiment of the present invention is capable of preventing bonding failure caused by thermal shock even when the difference between coefficients of thermal expansion of a light-emitting structure and a lead frame is large. Thus, the reliability of the light-emitting device package with respect to thermal shock can be increased. Furthermore, according to an embodiment of the present invention, a bonding region between the light-emitting device and the lead frame can be increased to improve bonding characteristics and heat dissipation characteristics.

DESCRIPTION OF DRAWINGS

FIG. 13 illustrates a backlight unit with a light-emitting device package according to an embodiment of the present invention.

MODES OF THE INVENTION

Figure 1:
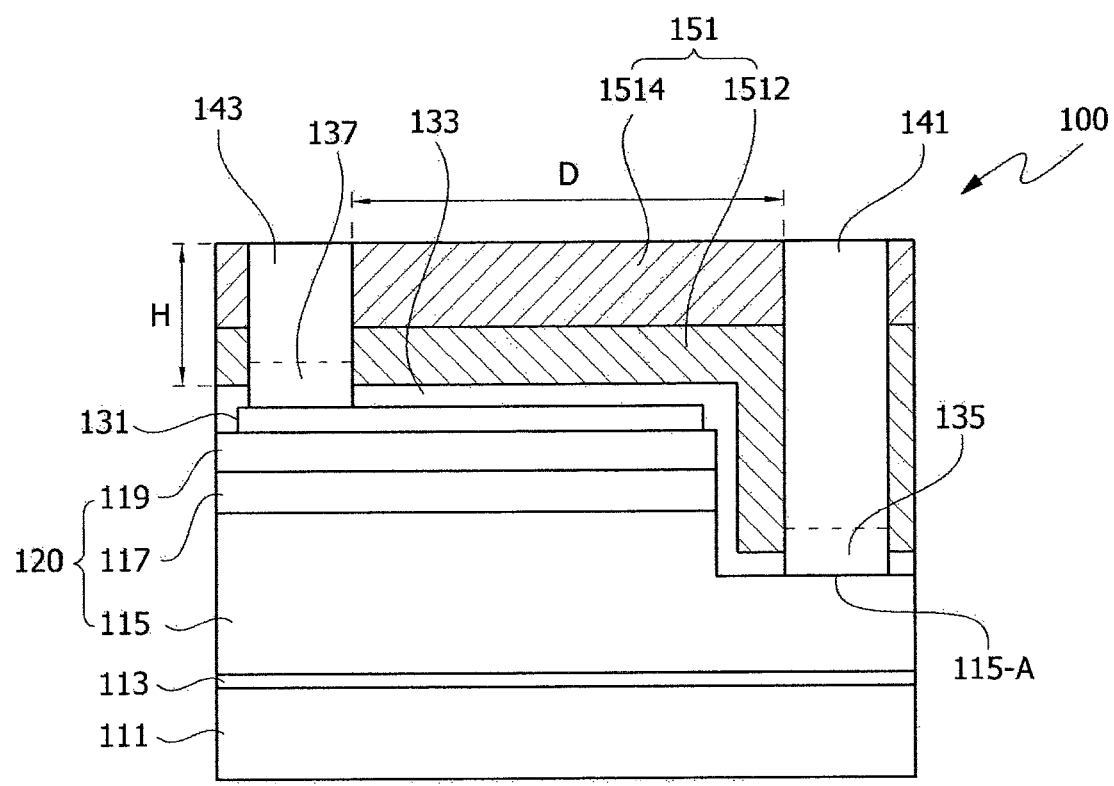
FIG. 1 is a cross-sectional view of a light-emitting device according to an embodiment of the present invention.

Various changes may be made in the present invention and the present invention may be implemented in various embodiments. Thus, exemplary embodiments will be illustrated in the drawings and described herein. However, the present invention is not limited thereto and should be understood to cover all modifications, equivalents, and alternatives falling within the idea and scope of the present invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used here, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that terms such as "comprise," or "comprising," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described in detail with reference to the accompanying drawings, in which the same or corresponding elements are represented by the same reference numerals regardless of a drawing number and are not redundantly described herein.

Figure 2:
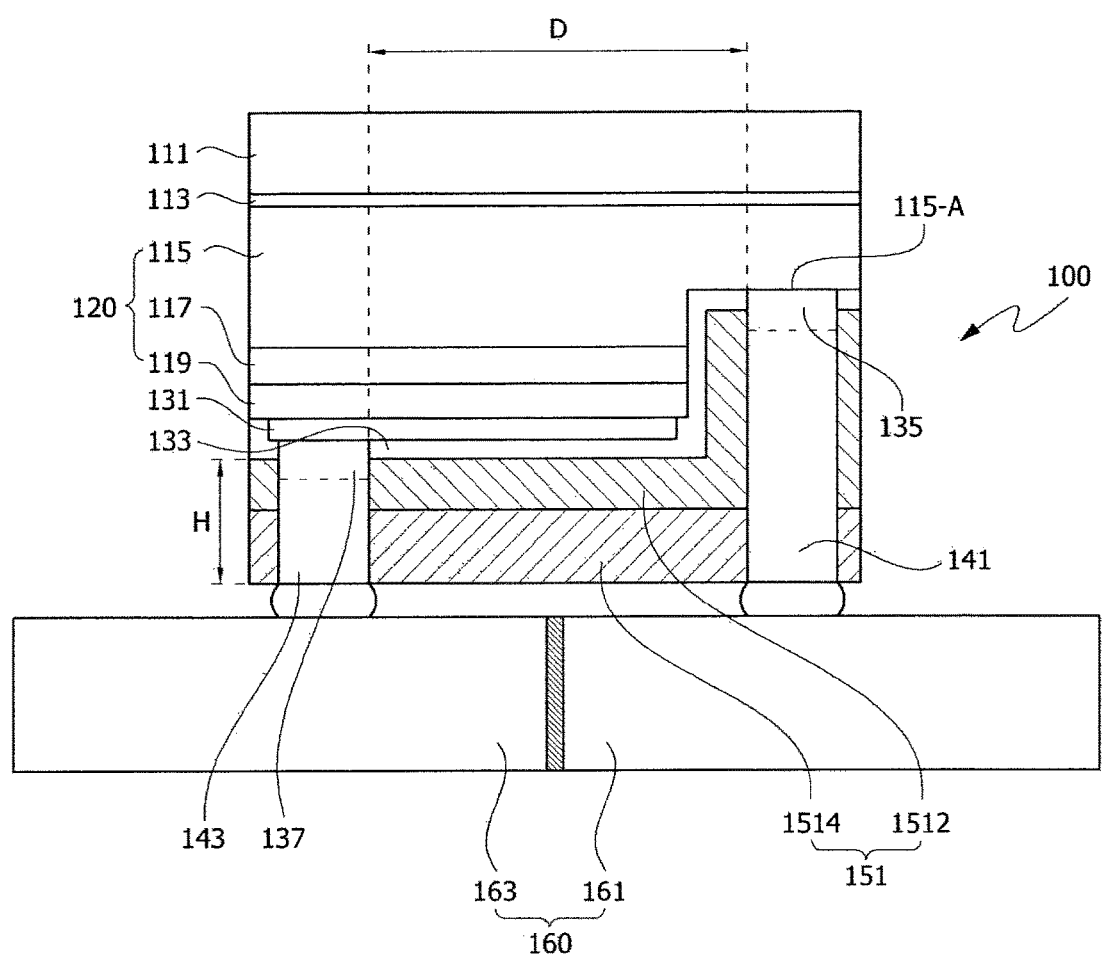
FIG. 2 is a cross-sectional view of a light-emitting device bonded onto a lead frame, according to an embodiment of the present invention.

FIG. 1 is a cross-sectional view of a light-emitting device according to an embodiment of the present invention. FIG. 2 is a cross-sectional view of a light-emitting device bonded onto a lead frame, according to an embodiment of the present invention.

Referring to FIGS. 1 and 2, a light-emitting device 100 includes a substrate 111, a first semiconductor layer 113, a first conductive type semiconductor layer 115, an active layer 117, a second conductive type semiconductor layer 119, a reflective electrode layer 131, an insulating layer 133, a first electrode 135, a second electrode 137, a first connecting electrode 141, a second connecting electrode 143, and a support member 151.

Here, the substrate 111 may be a translucent, insulating, or conductive substrate, and may include, for example, at least one among Al2O3, SiC, Si, GaAs, GaN, ZnO, Si, GaP, InP, Ge, and Ga2O3. Although not shown, a light extraction structure such as a concavo-convex pattern may be formed on one surface of the substrate 111. The concavo-convex pattern may be formed by etching the substrate 111. The concavo-convex pattern may include, for example, a stripe form or a convex lens form.

The first semiconductor layer 113 may be provided on the substrate 111. The first semiconductor layer 113 may consist of one layer or a plurality of layers. The first semiconductor layer 113 may include a group III-V compound semiconductor, e.g., at least one among GaN, InN, AlN, InGaN, AlGaN, InAlGaN and AlInN.

The first semiconductor layer 113 may be a buffer layer. In this case, the first semiconductor layer 113 may decrease a lattice constant difference between the substrate 111 and a light-emitting structure 120.

The first semiconductor layer 113 may be an undoped semiconductor layer. The undoped semiconductor layer may include a group III-V compound semiconductor, e.g., a GaN-based semiconductor. The undoped semiconductor layer has first conductive characteristics even when it is not intentionally doped with conductive dopants during the manufacture thereof, and has a conductive dopant concentration lower than that of the first conductive type semiconductor layer 115.

The light-emitting structure 120 may be provided on the first semiconductor layer 113. The light-emitting structure 120 may include a group III-V compound semiconductor, e.g., a semiconductor having an empirical formula of $In_xAl_yGa_{1-x-y}N$ (here, $0 \leq x \leq 1$, $0 \leq y \leq 1$, $0 \leq x+y \leq 1$), and may emit light of a peak wavelength ranging from an ultraviolet band to a visible-ray band.

The light-emitting structure 120 includes the first conductive type semiconductor layer 115, the second conductive type semiconductor layer 119, and the active layer 117 between the first conductive type semiconductor layer 115 and the second conductive type semiconductor layer 119.

That is, the first conductive type semiconductor layer 115 may be provided on the first semiconductor layer 113. The first conductive type semiconductor layer 115 includes a group III-V compound semiconductor doped with a first conductive type dopant. Here, the first conductive type semiconductor layer 115 may be an N type semiconductor layer, and the first conductive type dopant may be an N type dopant and include at least one among Si, Ge, Sn, Se, and Te.

The active layer 117 is provided on a portion of the first conductive type semiconductor layer 115. The active layer 117 may selectively include a single quantum well, a multi-quantum well (MQW), a quantum wire structure, or a quantum dot structure, and may have a periodicity of a well layer and a barrier layer. The well layer may have an empirical formula of $In_xAl_yGa_{1-x-y}N$ (here, $0 \leq x \leq 1$, $0 \leq y \leq 1$, $0 \leq x+y \leq 1$). The barrier layer may have an empirical formula of $In_xAl_yGa_{1-x-y}N$ (here, $0 \leq x \leq 1$, $0 \leq y \leq 1$, $0 \leq x+y \leq 1$). In this case, the well layer and the barrier layer may be formed using, for example, a stacked structure such as InGaN/GaN, AlGaN/GaN, InGaN/AlGaN, or InGaN/InGaN so as to have one period or more. Here, the barrier layer may include a semiconductor material having a band gap higher than that of the well layer.

Although not shown, a first conductive type clad layer may be formed between the first conductive type semiconductor layer 115 and the active layer 117. The first conductive type clad layer may include a GaN-based semiconductor. A band gap of the first conductive type clad layer may be higher than that of the active layer 117. The first conductive type clad layer may restrain carriers.

The second conductive type semiconductor layer 119 is provided on the active layer 117. The second conductive type semiconductor layer 119 may include a semiconductor doped with a second conductive type dopant, e.g., a compound semiconductor such as GaN, InN, AlN, InGaN, AlGaN, InAlGaN, or AlInN. In this case, the second conductive type semiconductor layer 119 may be a P type semiconductor layer, and the second conductive type dopant may be a P type dopant and may include at least one among Mg, Zn, Ca, Sr, and Ba.

The second conductive type semiconductor layer 119 may include a superstructure. The superstructure may include an InGaN/GaN superstructure or an AlGaN/GaN superstructure. The superstructure of the second conductive type semiconductor layer 119 may diffuse abnormal current present in a voltage to protect the active layer 117.

In the description above, the first conductive type semiconductor layer 115 being an N type semiconductor layer and the second conductive type semiconductor layer 119 being a P type semiconductor layer are merely examples, and embodiments are not limited thereto. Alternatively, the first conductive type semiconductor layer 115 may be a P type semiconductor layer and the second conductive type semiconductor layer 119 may be an N type semiconductor layer. A third conductive type semiconductor layer having a polarity opposite to a second conductive type may be formed on the second conductive type semiconductor layer 119.

Thus, the light-emitting structure 120 may be an N-P junction structure, a P-N junction structure, an N-P-N junction structure, or a P-N-P junction structure. Here, "P" refers to a P type semiconductor layer, "N" refers to an N type semiconductor layer, and "-" refers to direct or indirect contact between the P type semiconductor layer and the N type semiconductor layer.

The reflective electrode layer 131 is provided on the second conductive type semiconductor layer 119. The reflective electrode layer 131 may include at least one among an ohmic contact layer, a reflective layer, an anti-diffusion layer, and a protective layer. Here, the ohmic contact layer may be in contact with an upper portion of the second conductive type semiconductor layer 119, may include an indium tin oxide (ITO), an indium zinc oxide (IZO), an indium zinc tin oxide (IZTO), an indium aluminum zinc oxide (IAZO), an indium gallium zinc oxide (IGZO), an indium gallium tin oxide (IGTO), an aluminum zinc oxide (AZO), an antimony tin oxide (ATO), a gallium zinc oxide (GZO), SnO, InO, INZnO, ZnO, IrOx, RuOx, NiO, Ni, Cr, a selective combination thereof, or an alloy thereof, and may include at least one layer. The ohmic contact layer may have a thickness of 1 to 1,000 Å.

The reflective layer may include a material having a reflectance of 70% or more on the ohmic contact layer, e.g., a material selected from the group consisting of Al, Ag, Ru, Pd, Rh, Pt, Ir, and an alloy thereof. A metal of the reflective layer may make ohmic contact on the second conductive type semiconductor layer 119. In this case, the ohmic contact layer may be omitted. The reflective layer may have a thickness of 1 to 10,000 Å.

The anti-diffusion layer may include a material selected from the group consisting of Au, Cu, Hf, Ni, Mo, V, W, Rh, Ru, Pt, Pd, La, Ta, Ti, and an alloy thereof. The anti-diffusion layer may prevent interlayer diffusion at a boundary between different layers. The anti-diffusion layer may have a thickness of 1 to 10,000 Å.

The protective layer may include a material selected from the group consisting of Au, Cu, Hf, Ni, Mo, V, W, Rh, Ru, Pt, Pd, La, Ta, Ti, and an alloy thereof. The protective layer may have a thickness of 1 to 10,000 Å.

The reflective electrode layer 131 may have a stacked structure including a translucent electrode layer and a reflective layer. The translucent electrode layer may include a material selected from the group consisting of an indium tin oxide (ITO), an indium zinc oxide (IZO), an indium zinc tin oxide (IZTO), an indium aluminum zinc oxide (IAZO), an indium gallium zinc oxide (IGZO), an indium gallium tin oxide (IGTO), an aluminum zinc oxide (AZO), an antimony tin oxide (ATO), a gallium zinc oxide (GZO), SnO, InO, INZnO, ZnO, IrOx, and RuOx. The reflective layer may have a structure in which a first layer with a first refractive index and a second layer with a second refractive index are alternately stacked. In this case, the first refractive index and the second refractive index may be different from each other. The first and second layers may each be formed of a material with a refractive index ranging from 1.5 to 2.4, e.g., a conductive or insulating material. This structure may be defined as a distributed Bragg reflection (DBR) structure.

A light extraction structure such as a roughness may be formed on a surface of at least one of the second conductive type semiconductor layer 119 and the reflective electrode layer 131. Thus, a critical angle of incident light may be changed and thus light extraction efficiency may be improved.

The first electrode 135 may be formed in a region 115-A of the first conductive type semiconductor layer 115, i.e., a stepped region of the first conductive type semiconductor layer 115 in which the active layer 117 and the second conductive type semiconductor layer 119 are not provided. The second electrode 137 may be formed in a region of the reflective electrode layer 131. The first connecting electrode 141 may be connected to the first electrode 135. The second connecting electrode 143 may be connected to the second electrode 137. In this case, the first electrode 135 is electrically connected to a region of the first conductive type semiconductor layer 115. In this case, the first electrode 135 may be spaced apart from side surfaces of the active layer 117 and the second conductive type semiconductor layer 119, and may be smaller in size than the region 115-A of the first conductive type semiconductor layer 115.

The second electrode 137 may be electrically connected to the second conductive type semiconductor layer 119 via the reflective electrode layer 131. Although not shown, the first electrode 135 and the second electrode 137 may further include at least one among an adhesive layer, a reflective layer, an anti-diffusion layer, and a bonding layer. Here, the adhesive layer may make ohmic contact with the region 115-A of the first conductive type semiconductor layer 115, may include a material selected from among Cr, Ti, Co, Ni, V, Hf, and an alloy thereof, and may have a thickness of 1 to 1,000 Å. The reflective layer may be formed on the adhesive layer, may include a material selected from among Ag, Al, Ru, Rh, Pt, Pd, and an alloy thereof, and may have a thickness of 1 to 10,000 Å. The anti-diffusion layer may be formed on the reflective layer, may include a material selected from among Ni, Mo, W, Ru, Pt, Pd, La, Ta, Ti, and an alloy thereof, and may have a thickness of 1 to 10,000 Å. The bonding layer is a layer bonded with the first connecting electrode 141, may include a material selected from among Al, Ru, Rh, Pt, and an alloy thereof, and may have a thickness of 1 to 10,000 Å.

The second electrode 137 may have a stacked structure which is the same as or different from that of the first electrode 135.

The first connecting electrode 141 and the second connecting electrode 143 may provide a lead function to supply power and may provide a heat dissipation path. In this case, the first connecting electrode 141 and the second connecting electrode 143 may each have a pillar shape. In this case, the first connecting electrode 141 and the second connecting electrode 143 may include a material selected from among Ag, Al, Au, Cr, Co, Cu, Fe, Hf, In, Mo, Ni, Si, Sn, Ta, Ti, W, and an alloy thereof. The first connecting electrode 141 and the second connecting electrode 143 may each be plated with In, Sn, Ni, Cu, or an alloy thereof to improve adhesion with the first electrode 135 and the second electrode 137. In this case, a plating thickness may be 1 to 100,000 Å.

A plating layer may be further formed on surfaces of the first connecting electrode 141 and second connecting electrode 143. The plating layer may include tin or an alloy thereof, nickel or an alloy thereof, or a tin-Ag—Cu alloy, and may have a thickness of 0.5 µm to 10 µm. The plating layer may improve bonding with another bonding layer.

Here, a lead frame 160 may be bonded to top surfaces of the first connecting electrode 141 and the second connecting electrode 143. In this case, bonding surfaces of the first connecting electrode 141 and the second connecting electrode 143 bonded with the lead frame 160 may each have a width of 100 µm or more. When the bonding surfaces of the first connecting electrode 141 and the second connecting electrode 143 each have a width of less than 100 µm, the first connecting electrode 141 and the second connecting electrode 143 cannot be stably bonded with the lead frame 160. The first connecting electrode 141 and the second connecting electrode 143 may be bonded to the lead frame 160, for example, by soldering.

A distance D between the first connecting electrode 141 and the second connecting electrode 143 may be 80 µm or more. When the distance D between the first connecting electrode 141 and the second connecting electrode 143 is greater than 80 µm, a short circuit may occur.

The insulating layer 133 may be further provided on the reflective electrode layer 131. The insulating layer 133 may be formed on a top surface of the second conductive type semiconductor layer 119, side surfaces of the second conductive type semiconductor layer 119 and the active layer 117, and a top surface of the 115-A of the first conductive type semiconductor layer 115. The insulating layer 133 is formed in an upper region of the light-emitting structure 120 excluding the first electrode 135 and the second electrode 137 to electrically protect the upper region of the light-emitting structure 120.

The insulating layer 133 may include an insulating material or insulating resin including at least one among an oxide, a nitride, a fluoride, and a sulfide, each containing at least one among Al, Cr, Si, Ti, Zn, and Zr. The insulating layer 133 may include, for example, a material selected from among SiO2, Si3N4, Al2O3, and TiO2. The insulating layer 133 may be formed to prevent an interlayer short circuit from occurring in the light-emitting structure 120 when a metal structure is formed on the light-emitting structure 120 for flip bonding.

The insulating layer 133 may be formed only on a surface of the light-emitting structure 120 instead on the top surface of the reflective electrode layer 131.

The insulating layer 133 may include a first insulating layer and a second insulating layer which have different refractive indexes and are alternately arranged.

The support layer 151 supports the light-emitting device 100. To this end, the support layer 151 is formed on the light-emitting structure 120 and around the first electrode 135, the second electrode 137, the first connecting electrode 141, and the second connecting electrode 143. Here, the support layer 151 may include an oxide, a nitride, a fluoride, or a sulfide containing at least one selected from the group consisting of Al, Cr, Si, Ti, Zn, Zr, and B. In this case, the content of the oxide, the nitride, the fluoride, or the sulfide containing at least one selected from the group consisting of Al, Cr, Si, Ti, Zn, Zr, and B may be 20 to 100 wt % with respect to the total weight of the support layer 151. The oxide, the nitride, the fluoride or the sulfide containing at least one selected from the group consisting of Al, Cr, Si, Ti, Zn, Zr, and B may serve as a heat diffusion agent in the support layer 151. The support layer 151 may further include insulating resin. When the support layer 151 further includes insulating resin, the adhesive strength of the support layer 151 may be improved. The insulating resin may be, for example, silicon resin or epoxy resin. In this case, the content of the insulating resin may be 60 wt % or less with respect to the total weight of the support layer 151. When the support layer 151 includes insulating resin, the support layer 151 may further include glass fiber. When the support layer 151 further includes glass fiber, the support layer 151 may withstand thermal shock or mechanical shock and have high heat resistance. In this case, the content of the glass fiber may be 70 wt % or less with respect to the total weight of the support layer 151.

When the support layer 151 includes less than 20 wt % of the oxide, the nitride, the fluoride, or the sulfide containing at least one selected from the group consisting of Al, Cr, Si, Ti, Zn, Zr, and B, the heat diffusion performance of the support layer 151 may deteriorate. When the support layer 151 includes more than 60 wt % of insulating resin, the content of the oxide, the nitride, the fluoride, or the sulfide containing at least one selected from the group consisting of Al, Cr, Si, Ti, Zn, Zr, and B may decrease and thus the heat diffusion performance of the support layer 151 may deteriorate and a coefficient of thermal expansion of the insulating resin may be high. Thus, the support layer 151 may become vulnerable to thermal shock. When the support layer 151 includes more than 70 wt % of glass fiber, the content of the oxide, the nitride, the fluoride, or the sulfide containing at least one selected from the group consisting of Al, Cr, Si, Ti, Zn, Zr, and B may decrease and thus the heat diffusion performance of the support layer 151 may deteriorate and the support layer 151 is likely to break due to the glass fiber.

In this case, the support layer 151 includes a first support layer 1512 having a first coefficient of thermal expansion, and a second support layer 1514 provided on the first support layer 1512 and having a second coefficient of thermal expansion.

As described above, when the support layer 151 has different coefficients of thermal expansion, thermal shock caused by different coefficients of thermal expansion of the light-emitting structure 120, the support layer 150, and the lead frame 160 may be lessened.

In this case, a total thickness H of the support layer 151 may be 20 to 400 μm, and the first support layer 1512 and the second support layer 1514 may each have a thickness of 10 to 390 μm. Here, the total thickness H of the support layer 151 refers to a total thickness of the support layer 151 formed on the second conductive type semiconductor layer 119. When the support layer 151 has a thickness of less than 20 μm, the first support layer 1512 and the second support layer 1514 stacked may have a thickness of less than 10 μm and thus the strength of the support layer 151 may decrease. Thus, it is difficult to support the light-emitting device 100. When the support layer 151 has a thickness greater than 400 μm, a thickness of the light-emitting device 100 increases and thus does not satisfy the current trend of slim light-emitting devices.

Here, the thickness of the first support layer 1512 may be greater than that of the second support layer 1514. When the thickness of the first support layer 1512 is greater than that of the second support layer 1514, the light-emitting device 100 may be better supported.

The second coefficient of thermal expansion in the second support layer 1514 may be greater than the first coefficient of thermal expansion in the first support layer 1512. Generally, a coefficient of thermal expansion of the lead frame 160 to which the first connecting electrode 141 and the second connecting electrode 143 are bonded is greater than those of the light-emitting structure 120 and the substrate 111. Thus, when the second coefficient of thermal expansion in the second support layer 1514 adjacent to the lead frame 160 is greater than the first coefficient of thermal expansion in the first support layer 1512 adjacent to the substrate 111, the coefficients of thermal expansion may gradually increase from the first support layer 1512 to the second support layer 1514 to the lead frame 160, thereby preventing interfacial deadhesion from occurring due to a sharp change in the coefficient of thermal expansion.

In detail, the difference between a coefficient of thermal expansion of the substrate 111 and the first coefficient of thermal expansion in the first support layer 1512 may be 0.1 to 5 ppm/° C., and the difference between the second coefficient of thermal expansion in the second support layer 1514 and the coefficient of thermal expansion of the lead frame 160 may be 0.1 to 5 ppm/° C. When the difference between the coefficient of thermal expansion of the substrate 111 and the first coefficient of thermal expansion in the first support layer 1512 is less than 0.1 ppm/° C., the difference between the second coefficient of thermal expansion in the second support layer 1514 and the coefficient of thermal expansion of the lead frame 160 is relatively large. Thus, reliability of the lead frame 160 with respect to thermal shock may decrease. When the difference between the coefficient of thermal expansion of the substrate 111 and the first coefficient of thermal expansion in the first support layer 1512 is greater than 5 ppm/° C., the performance of the first support layer 1512 capable of supporting the substrate 111 and the light-emitting structure 120 may decrease and thus reliability of the substrate 111 with respect to thermal shock may decrease. Similarly, when the difference between the second coefficient of thermal expansion in the second support layer 1514 and the coefficient of thermal expansion of the lead frame 160 is less than 0.1 ppm/° C., the difference between coefficients of thermal expansion of the substrate 111 and the first support layer 1512 is relatively large. Thus, reliability of the substrate 111 with respect to thermal shock may decrease. When the difference between the second coefficient of thermal expansion in the second support layer 1514 and the coefficient of thermal expansion of the lead frame 160 is greater than 5 ppm/° C., the performance of the second support layer 1514 capable of supporting the first connecting electrode 141, the second connecting electrode 143 and the lead frame 160 may deteriorate and thus reliability of the lead frame 160 with respect to thermal shock may decrease.

In this case, the difference between the first coefficient of thermal expansion in the first support layer 1512 and the second coefficient of thermal expansion in the second support layer 1514 may be 0.1 to 10 ppm/° C. When the difference between the first coefficient of thermal expansion in the first support layer 1512 and the second coefficient of thermal expansion in the second support layer 1514 is less than 0.1 ppm/° C., a bonding failure may occur due to the difference between coefficients of thermal expansion of the substrate 111 and the lead frame 160. When the difference between the first coefficient of thermal expansion in the first support layer 1512 and the second coefficient of thermal expansion in the second support layer 1514 is greater than 10 ppm/° C., interfacial deadhesion may occur between the first support layer 1512 and the second support layer 1514.

For example, when the coefficient of thermal expansion of the substrate 111 is about 5 ppm/° C. and the coefficient of thermal expansion of the lead frame 160 is about 20 ppm/° C., the first coefficient of thermal expansion in the first support layer 1512 may be about 5 to 10 ppm/° C. and the second coefficient of thermal expansion in the second support layer 1514 may be about 10 to 20 ppm/° C.

In this case, the first the support layer 1512 may be provided to surround an interface between the first electrode 135 and the first connecting electrode 141 and an interface between the second electrode 137 and the second connecting electrode 143. Thus, the first support layer 1512 may support the substrate 111, the first semiconductor layer 113, and the light-emitting structure 120 and thus protect them from thermal shock.

Although it has been described above for convenience of explanation that the first semiconductor layer 113 is provided on the substrate 111, the light-emitting structure 120 is provided on the first semiconductor layer 113, and the first electrode 135 and the second electrode 137 are provided on the light-emitting structure 120, this merely means that the substrate 110, the first semiconductor layer 113, the light-emitting structure 120, and the first electrode 135/the second electrode 137 are sequentially stacked. Thus, an upper or lower part of the light-emitting device 100 is not limited by the above description.

Figure 3:
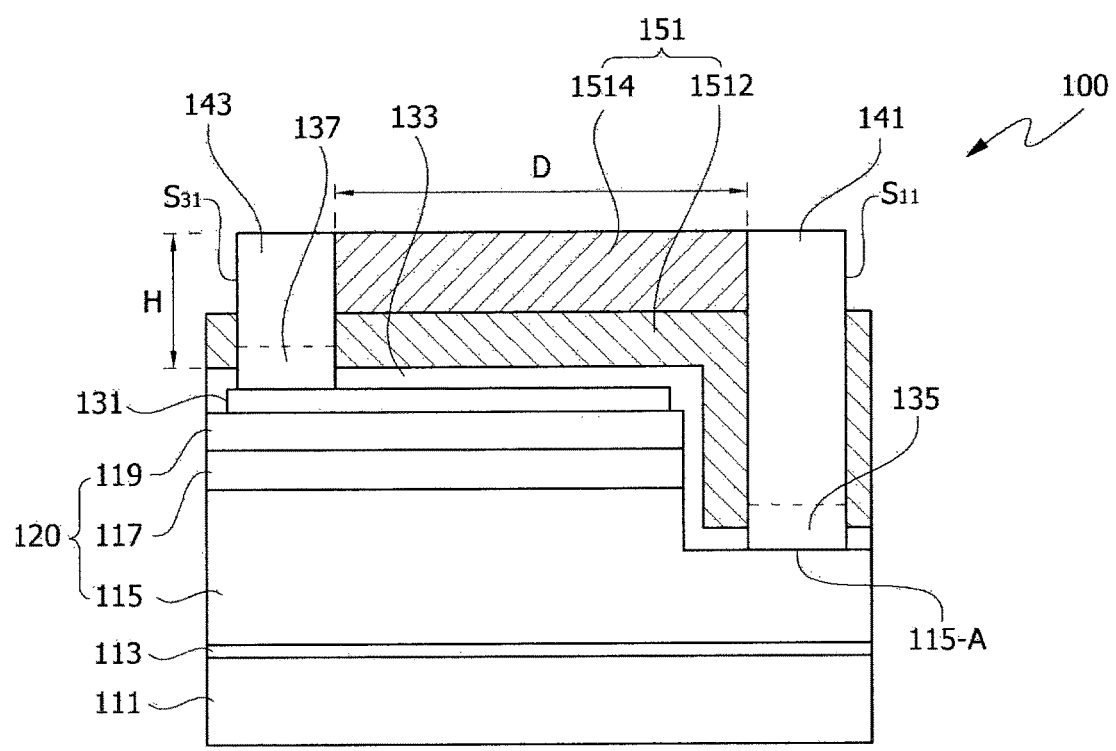
FIG. 3 is a cross-sectional view of a light-emitting device according to another embodiment of the present invention.
Figure 4:
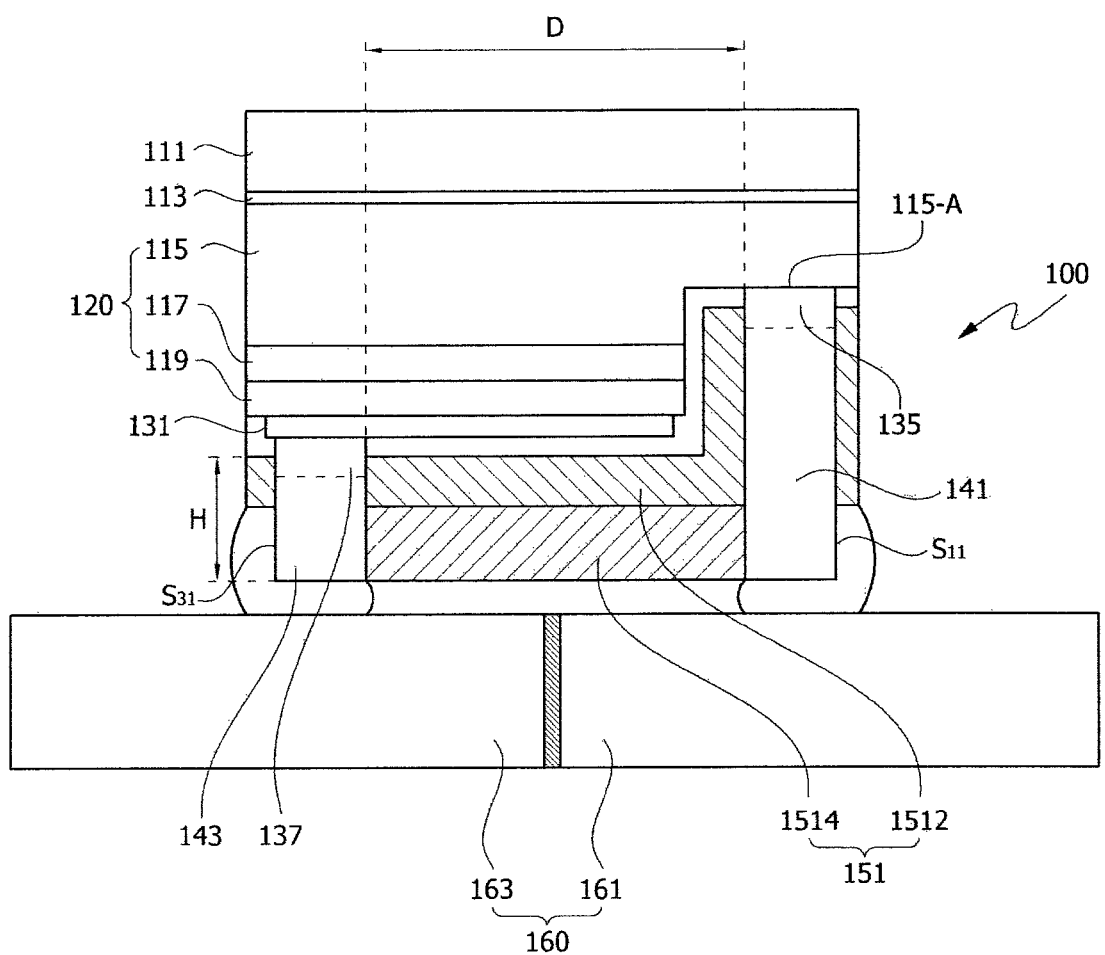
FIG. 4 is a cross-sectional view of a light-emitting device bonded onto a lead frame, according to another embodiment of the present invention.

FIG. 3 is a cross-sectional view of a light-emitting device according to another embodiment of the present invention. FIG. 4 is a cross-sectional view of a light-emitting device bonded onto a lead frame, according to another embodiment of the present invention. A description of parts of FIGS. 3 and 4 which are the same as those of FIGS. 1 and 2 will be omitted here.

Referring to FIGS. 3 and 4, a light-emitting device 100 includes a substrate 111, a first semiconductor layer 113, a first conductive type semiconductor layer 115, an active layer 117, a second conductive type semiconductor layer 119, a reflective electrode layer 131, an insulating layer 133, a first electrode 135, a second electrode 137, a first connecting electrode 141, a second connecting electrode 143, and a support layer 151.

The support layer 151 includes a first support layer 1512 having a first coefficient of thermal expansion, and a second support layer 1514 provided on the first support layer 1512 and having a second coefficient of thermal expansion.

In this case, at least some parts of a side surface S11 of the first connecting electrode 141 and a side surface S3 of the second connecting electrode 143 may be exposed. To this end, the second support layer 1514 may be provided only in a region between the first connecting electrode 141 and the second connecting electrode 143. Thus, soldering may be performed on parts of the side surfaces of the first connecting electrode 141 and the second connecting electrode 143 and top surfaces thereof. Accordingly, a bonding area may be increased and bonding characteristics and heat dissipation characteristics may be improved.

Figure 5:
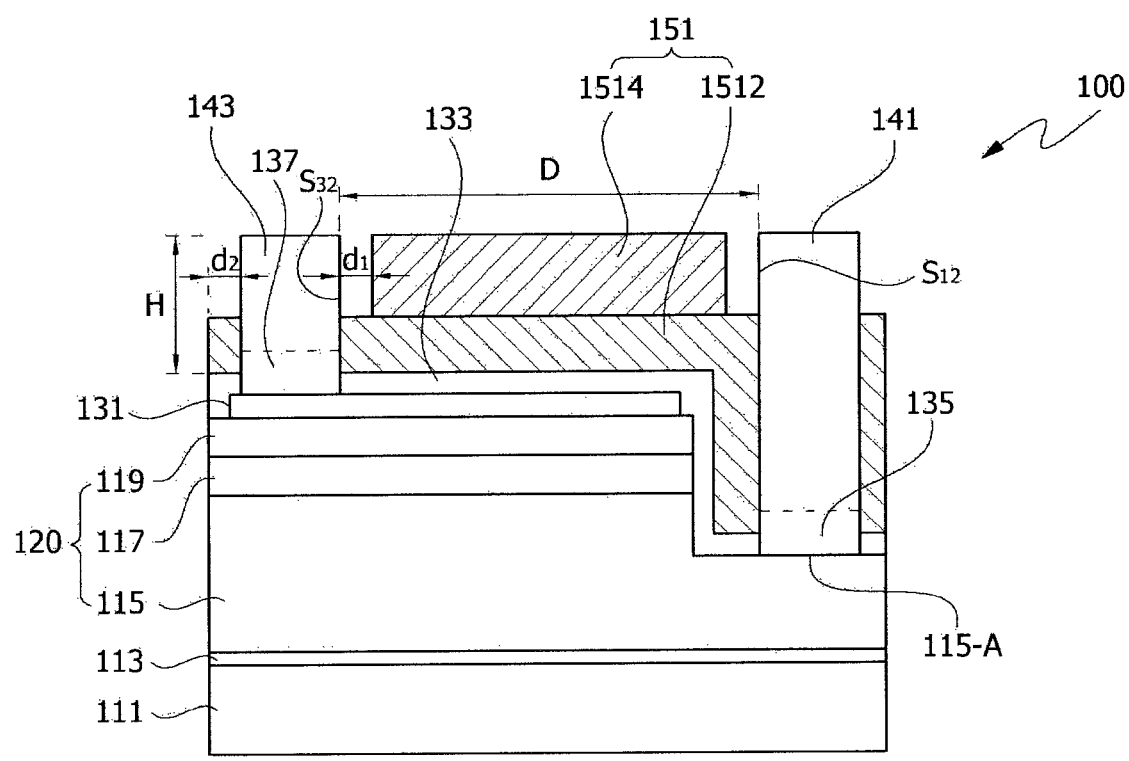
FIG. 5 is a cross-sectional view of a light-emitting device according to another embodiment of the present invention.
Figure 6:
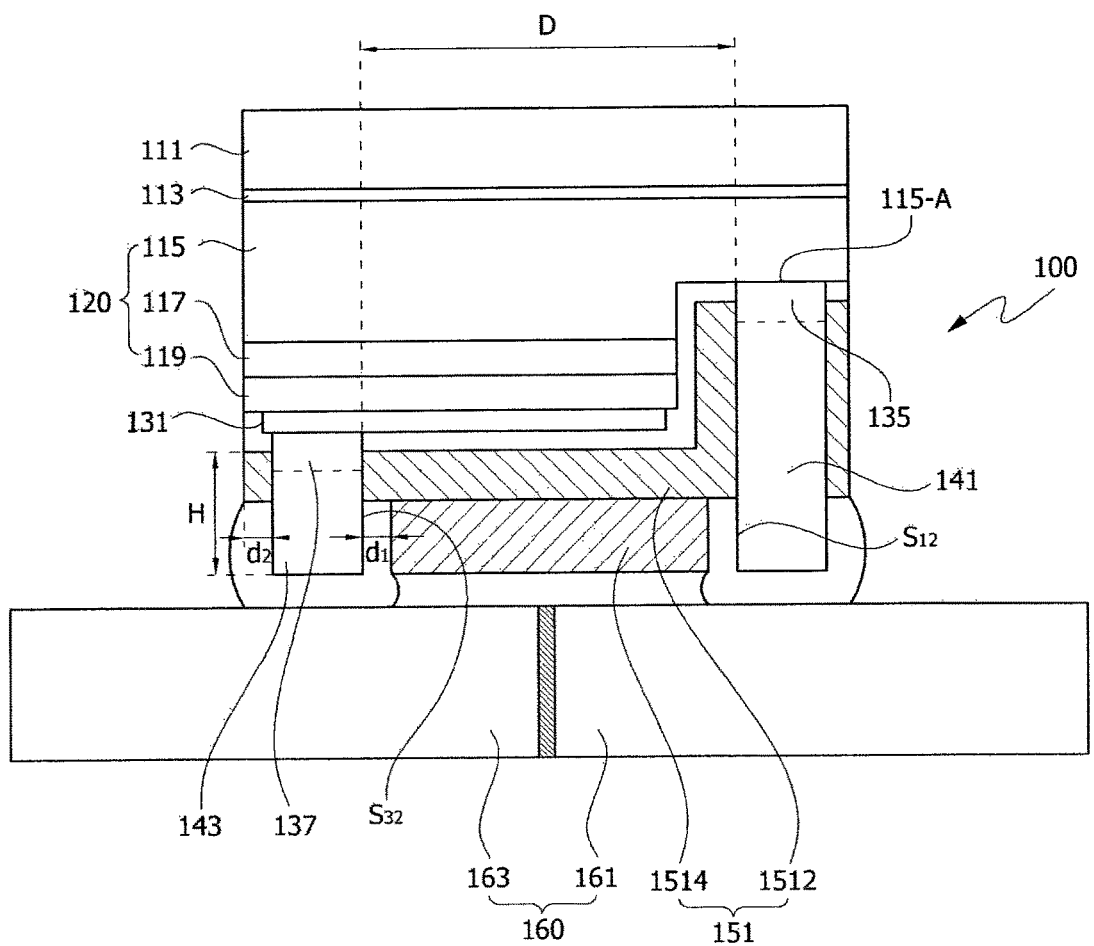
FIG. 6 is a cross-sectional view of a light-emitting device bonded onto a lead frame, according to another embodiment of the present invention.

FIG. 5 is a cross-sectional view of a light-emitting device according to another embodiment of the present invention. FIG. 6 is a cross-sectional view of a light-emitting device bonded onto a lead frame, according to another embodiment of the present invention. A description of parts of FIGS. 5 and 6 which are the same as those of FIGS. 1 and 2 will be omitted here.

Referring to FIGS. 5 and 6, a light-emitting device 100 includes a substrate 111, a first semiconductor layer 113, a first conductive type semiconductor layer 115, an active layer 117, a second conductive type semiconductor layer 119, a reflective electrode layer 131, an insulating layer 133, a first electrode 135, a second electrode 137, a first connecting electrode 141, a second connecting electrode 143, and a support layer 151.

The support layer 151 includes a first support layer 1512 having a first coefficient of thermal expansion, and a second support layer 1514 provided on the first support layer 1512 and having a second coefficient of thermal expansion.

In this case, the second support layer 1514 of the support layer 151 may be spaced apart from a side surface S12 of the first connecting electrode 141 and a side surface S32 of the second connecting electrode 143. That is, top and side surfaces of the first connecting electrode 141 and the second connecting electrode 143 may be exposed. Accordingly, a bonding area for soldering is increased and thus bonding characteristics and heat dissipation characteristics may be improved in comparison to the embodiments of FIGS. 1 to 4.

In this case, a distance d1 between the second support layer 1514 and either the side surface S12 of the first connecting electrode 141 or the side surface S32 of the second connecting electrode 143 may be equal to or less than a distance d2 between either another surface S11 of the first connecting electrode 141 or another surface S31 of the second connecting electrode 143 and an outer side of the light-emitting device 100. When the distance d1 between the second support layer 1514 and either the side surface S12 of the first connecting electrode 141 or the side surface S32 of the second connecting electrode 143 is greater than the distance d2 between either the surface S11 of the first connecting electrode 141 or the surface S31 of the second connecting electrode 143 and the outer side of the light-emitting device 100, a solder applied to the first connecting electrode 141 and a solder applied to the second connecting electrode 143 may meet together and thus a short-circuit failure may occur.

Figure 7:
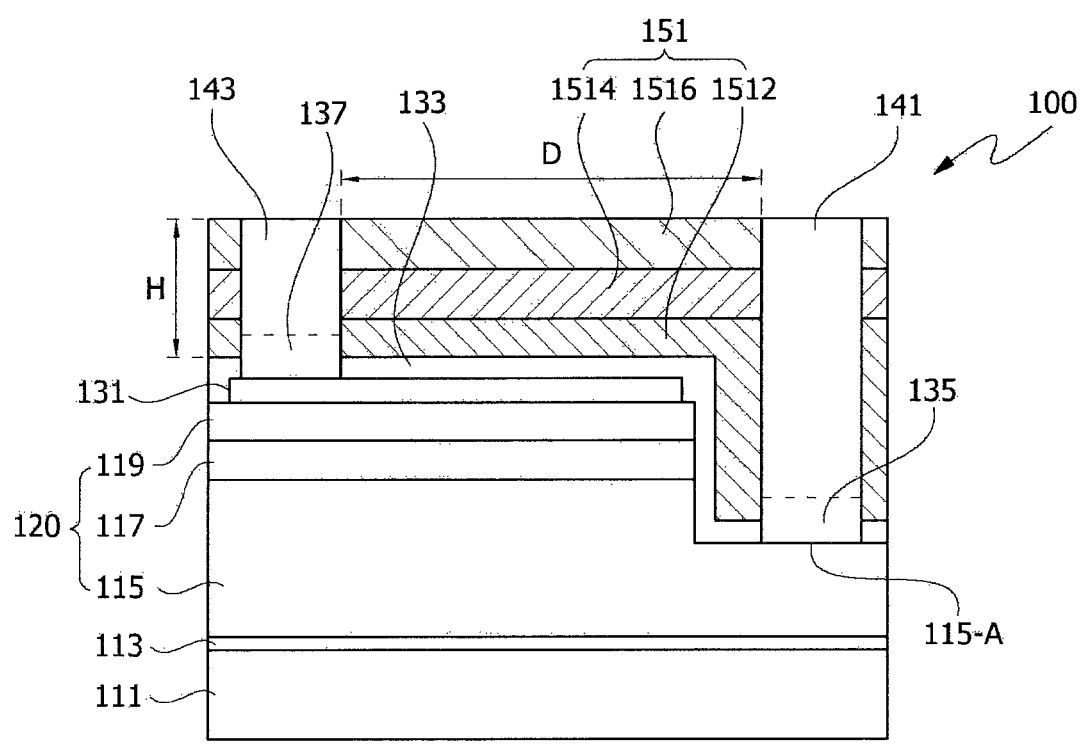
FIG. 7 is a cross-sectional view of a light-emitting device according to another embodiment of the present invention.
Figure 8:
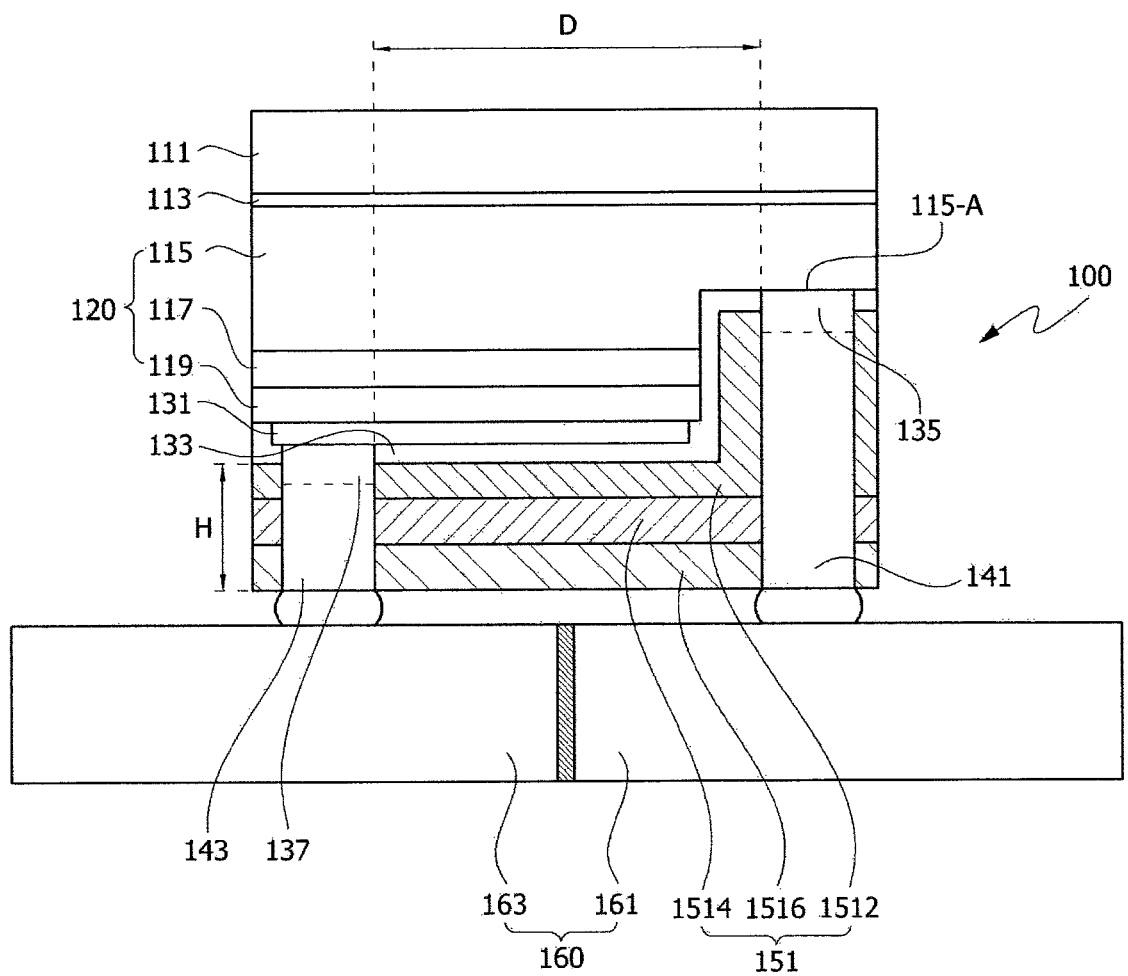
FIG. 8 is a cross-sectional view of a light-emitting device bonded onto a lead frame, according to another embodiment of the present invention.

FIG. 7 is a cross-sectional view of a light-emitting device according to another embodiment of the present invention. FIG. 8 is a cross-sectional view of a light-emitting device bonded onto a lead frame, according to another embodiment of the present invention. A description of parts of FIGS. 7 and 8 which are the same as those of FIGS. 1 and 2 will be omitted here.

Referring to FIGS. 7 and 8, a light-emitting device 100 includes a substrate 111, a first semiconductor layer 113, a first conductive type semiconductor layer 115, an active layer 117, a second conductive type semiconductor layer 119, a reflective electrode layer 131, an insulating layer 133, a first electrode 135, a second electrode 137, a first connecting electrode 141, a second connecting electrode 143, and a support layer 151.

The support layer 151 includes a first support layer 1512 having a first coefficient of thermal expansion, a second support layer 1514 provided on the first support layer 1512 and having a second coefficient of thermal expansion, and a third support layer 1516 provided on the second support layer 1514 and having a third coefficient of thermal expansion. In this case, thicknesses of these support layers may decrease from the first support layer 1512 to the second support layer 1514 to the third support layer 1516. That is, a support layer closer to the substrate 111 needs strength for supporting the light-emitting device 100 and may thus be more thickly formed. The coefficients of thermal expansion may increase from the first coefficient of thermal expansion to the second coefficient of thermal expansion to the third coefficient of thermal expansion. This is because a coefficient of thermal expansion of a lead frame is greater than that of the substrate 111.

Although it has been described above for convenience of explanation that a total of three support layers are connected to one another, embodiments are not limited thereto. The number of support layers stacked may be three or more. As the difference between coefficients of thermal expansion of the substrate 111 and the lead frame 160 increases, more support layers may be stacked.

In this case, the difference between the coefficient of thermal expansion of the substrate 111 and a coefficient of thermal expansion of a lowermost support layer, e.g., the first support layer 1512, may be 0.1 to 5 ppm/° C., and the difference between a coefficient of thermal expansion of an uppermost support layer, e.g., the third coefficient of thermal expansion in the third support layer 1516, and the coefficient of thermal expansion of the lead frame 160 may be 0.1 to 5 ppm/° C. However, the difference between coefficients of thermal expansion of these support layers, e.g., the difference between the first coefficient of thermal expansion in the first support layer 1512 and the second coefficient of thermal expansion in the second support layer 1514 or the difference between the second coefficient of thermal expansion in the second support layer 1514 and the third coefficient of thermal expansion in the third support layer 1516, may be 0.1 to 10 ppm/° C.

When the difference between coefficients of thermal expansion of these support layers support layer is less than 0.1 ppm/° C., a bonding failure problem caused by different coefficients of thermal expansion of the substrate 111 and the lead frame 160 cannot be solved. When the difference between coefficients of thermal expansion of these support layers support layer is greater than 10 ppm/° C., interfacial deadhesion may occur between the support layers.

Figure 9:
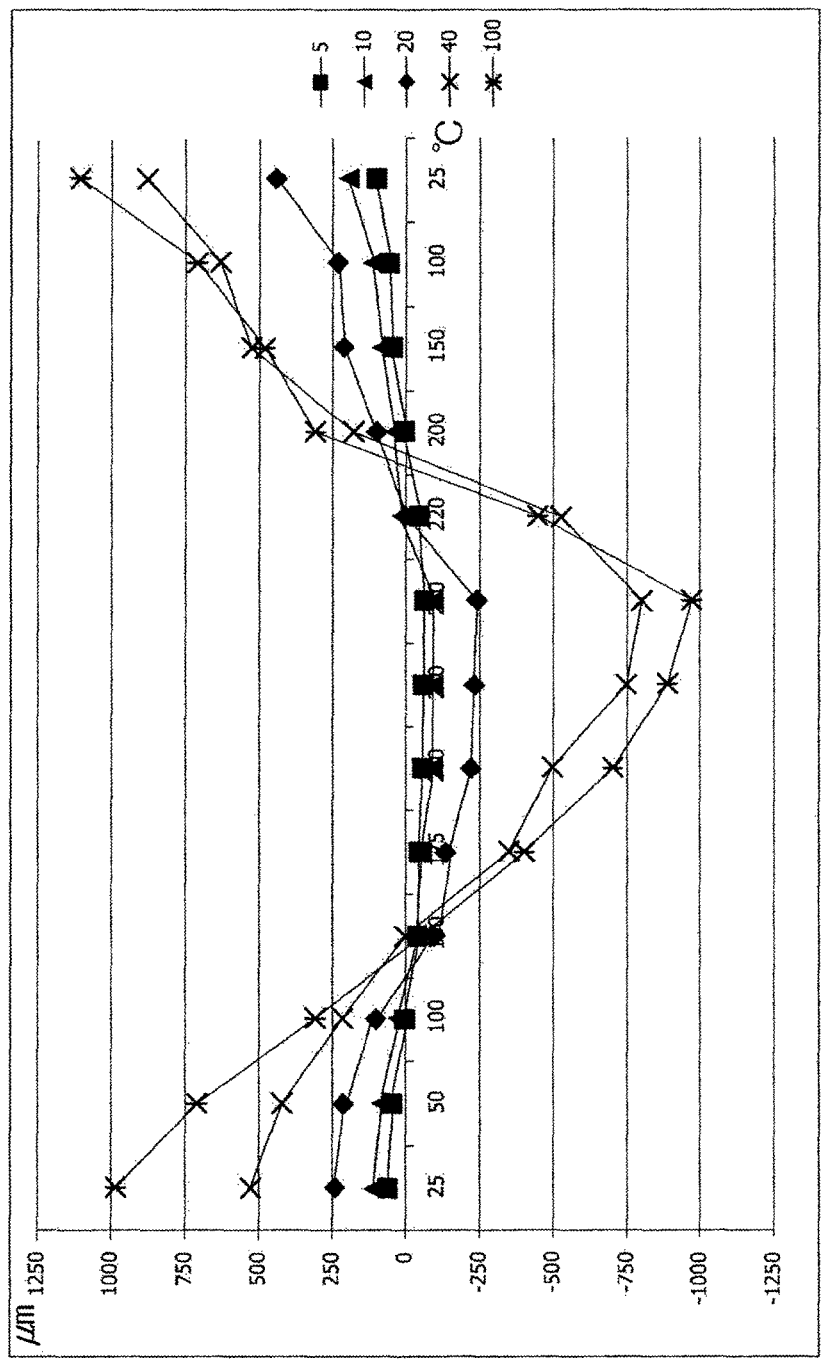
FIG. 9 is a graph showing the results of an experiment comparing warpage to the difference between thermal expansion coefficients of a light-emitting structure and a support layer.

FIG. 9 is a graph showing the results of an experiment comparing warpage to the difference between coefficients of thermal expansion of a light-emitting structure and a support layer. When a coefficient of thermal expansion (CTE) of the light-emitting structure was 5 ppm/° C., degrees of warpage in support layers of which coefficients of thermal expansion were 5 ppm/° C., 10 ppm/° C., 20 ppm/° C., 40 ppm/° C., and 100 ppm/° C. were measured against temperature. In the graph, the horizontal axis denotes temperature (° C.) and the vertical axis denotes warpage (μm).

Referring to FIG. 9, when a support layer with a coefficient of thermal expansion having a small difference with that of the light-emitting structure, e.g., a support layer of which a coefficient of thermal expansion is 5 or 10 ppm/° C., was used, degrees of warpage between the light-emitting structure and the support layer at various temperatures were not large. In contrast, when a support layer of which a coefficient of thermal expansion is 20 ppm/° C. or more was used, degrees of warpage were large. In particular, a maximum degree of warpage occurred at about 260° C. which is a heat treatment temperature for bonding or at about room temperature.

Figure 10:
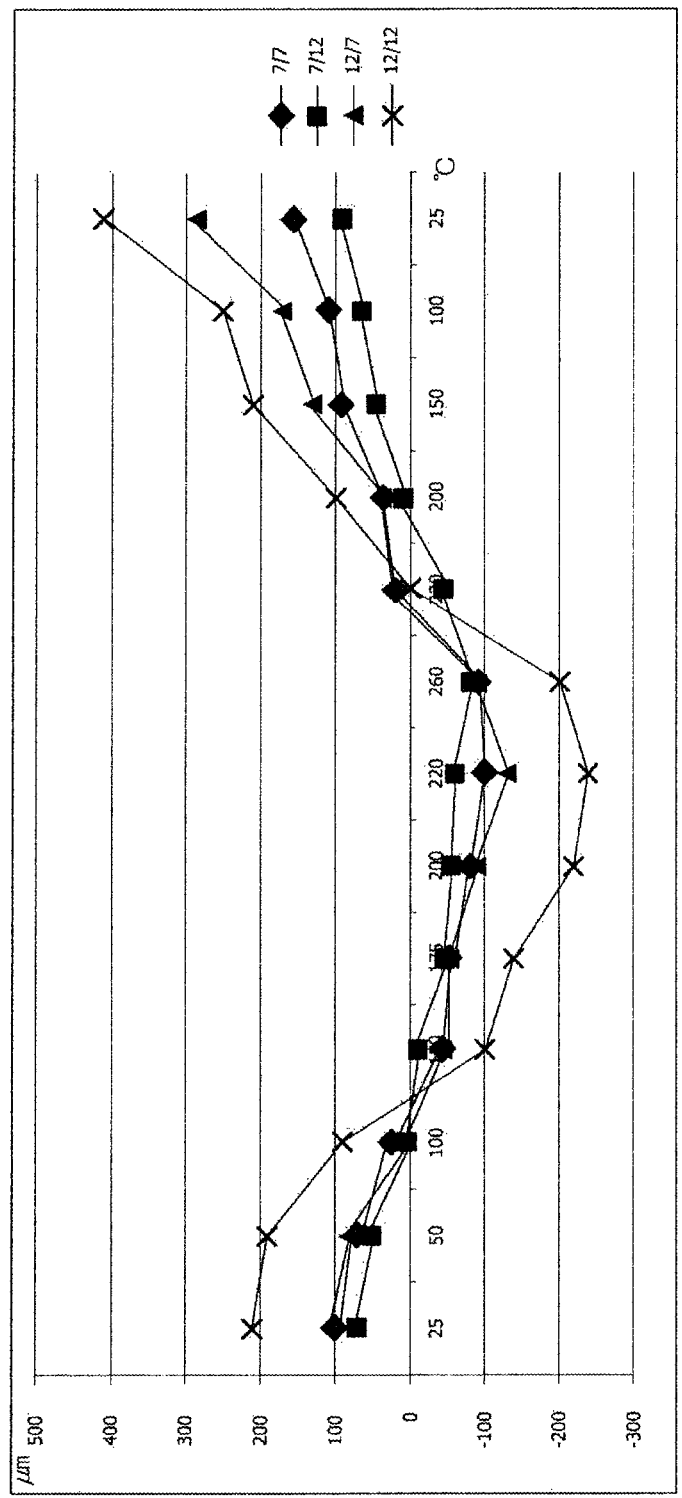
FIG. 10 is a graph showing warpage according to the difference in thermal expansion coefficients among a light-emitting structure, a support layer, and a lead frame.

FIG. 10 is a graph showing the results of an experiment comparing warpage to the difference between coefficients of thermal expansion of a light-emitting structure, a support layer, and a lead frame. When a coefficient of thermal expansion (CTE) of the light-emitting structure was 5 ppm/° C., a coefficient of thermal expansion of the lead frame was 15 ppm/° C., and coefficients of thermal expansion of two support layers stacked together were respectively 7 ppm/° C. and 7 ppm/° C., 7 ppm/° C. and 12 ppm/° C., 12 ppm/° C. and 7 ppm/° C., or 12 ppm/° C. and 12 ppm/° C., degrees of warpage thereof were measured. In the graph, the horizontal axis denotes temperature (° C.) and the vertical axis denotes warpage (μm).

Referring to FIG. 10, when the two support layers had the same coefficient of thermal expansion or one of the support layers adjacent to the light-emitting structure had a coefficient of thermal expansion larger than that of the other support layer adjacent to the lead frame, a maximum degree of warpage among the light-emitting structure, the support layers, and the lead frame occurred at 260° C. which is a heat treatment temperature for bonding or more or at about room temperature. In contrast, when two support layers had different coefficients of thermal expansion and the support layer adjacent to the light-emitting structure had a smaller coefficient of thermal expansion than that of the support layer adjacent to the lead frame as in an embodiment of the present disclosure, degrees of warpage at various temperatures were low.

Figure 11:
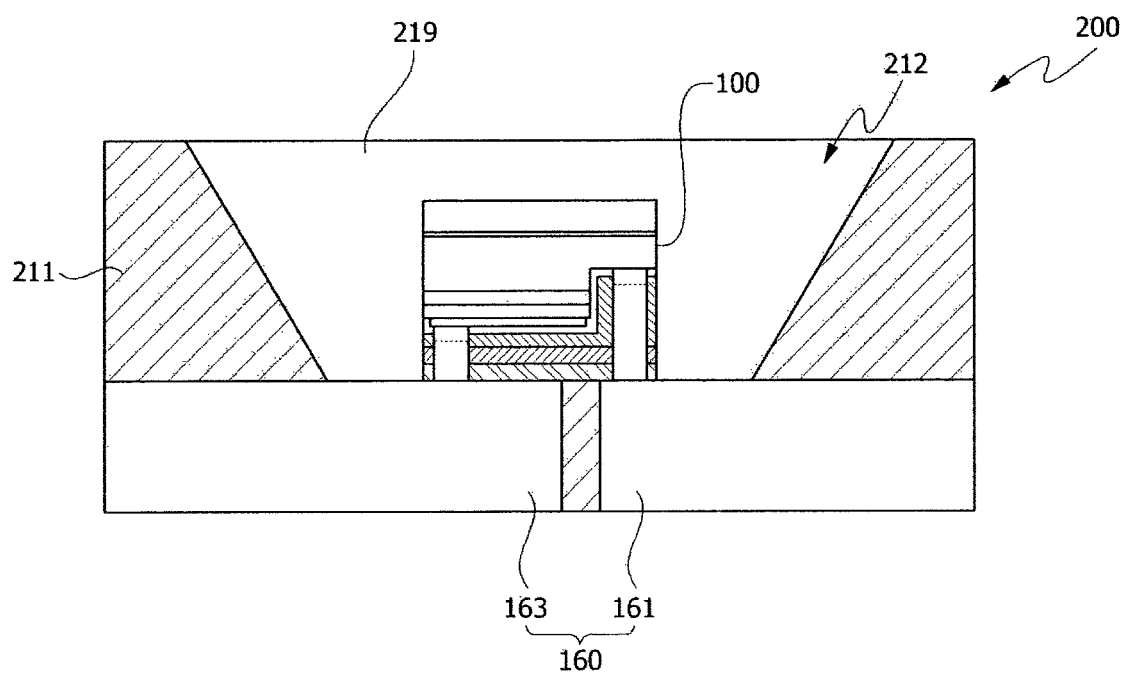
FIG. 11 is a cross-sectional view of a light-emitting device package with a light-emitting device according to an embodiment of the present invention.

FIG. 11 is a cross-sectional view of a light-emitting device package with a light-emitting device according to an embodiment of the present invention.

Referring to FIG. 11, a light-emitting device package 200 includes a body part 211, a first lead electrode 161 and a second lead electrode 163 installed on the body part 211, a molding member 219 and a light-emitting device 100.

The body part 211 may be injection-molded from polymer resin or plastic resin or may be formed in a single-layer or multi-layer substrate stacked structure. The body part 211 may include a cavity 212 with an open upper part. Surfaces of the cavity 212 may be inclined or perpendicular to a bottom surface thereof.

In the cavity 212, the first lead electrode 161 and the second lead electrode 163 are arranged to be spaced apart from each other. In the present disclosure, the first lead electrode 161 and the second lead electrode 163 may be referred to together as a lead frame 160.

The light-emitting device 100 is flip-bonded onto the first lead electrode 161 and the second lead electrode 163. That is, a first connecting electrode 141 of the light-emitting device 100 is bonded to the first lead electrode 161, and a second connecting electrode 143 thereof is bonded to the second lead electrode 163.

In the cavity 212, the molding member 219 may be formed. The molding member 219 may be formed of a translucent resin material such as silicon or epoxy and may include a fluorescent material.

Light generated in the light-emitting device 100 may be extracted through top and side surfaces of the light-emitting device 100. The extracted light may be discharged to the outside via the molding member 219.

Although it has been described above for convenience of explanation that the light-emitting device package 200 includes one light-emitting device 100, embodiments are not limited thereto and a plurality of light-emitting devices may be mounted on the light-emitting device package 200.

A light-emitting device package according to an embodiment of the present invention is variously applicable to various illumination devices, backlight units (BLU) for a display devices, ultra-high definition (UHD) TVs, laptop computers, tablet personal computers (PC), cameras, portable terminals, etc.

Figure 12:
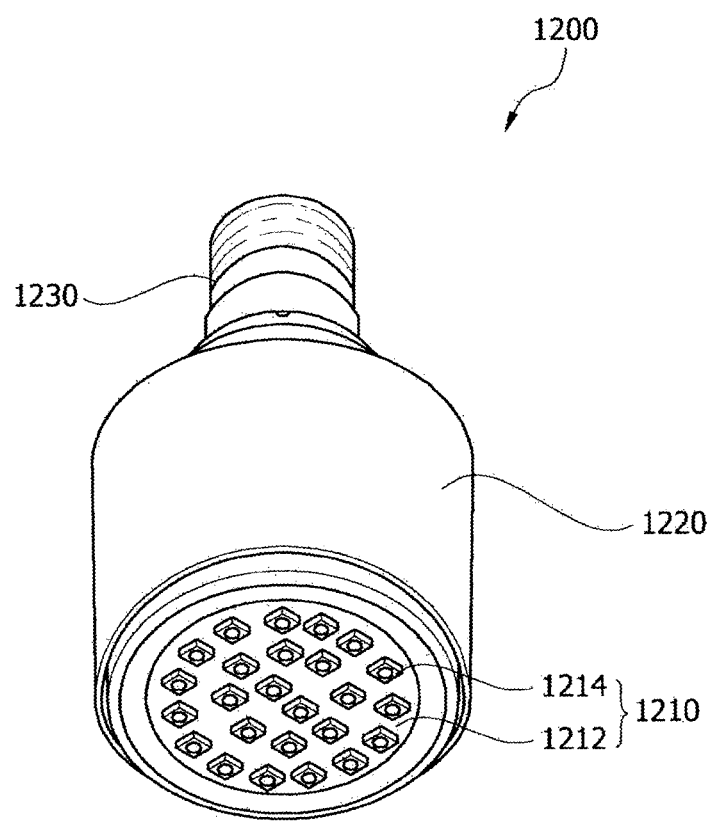
FIG. 12 illustrates an illumination device with a light-emitting device package according to an embodiment of the present invention.

FIG. 12 illustrates an illumination device with a light-emitting device package according to an embodiment of the present invention.

Referring to FIG. 12, an illumination device 1200 includes a light-emitting module 1210, a case 1220, and a connecting terminal 1230.

The light-emitting module 1210 is accommodated in the case 1220. The connecting terminal 1230 is coupled to the case 1220 and supplies an external power source (not shown) to the light-emitting module 1210. The connecting terminal 1230 is illustrated as being in the form of a socket to be connected to the external power source, but is not limited thereto.

The light-emitting module 1210 includes a substrate 1212 and at least one light-emitting device package 1214. The at least one light-emitting device package 1214 is mounted on the substrate 1212. The light-emitting device package 1214 may be a light-emitting device package according to an embodiment of the present invention. Although not shown, the illumination device 1200 may further include a heat sink accommodated in the case 1220 and coupled to the light-emitting module 1210.

FIG. 13 illustrates a backlight unit with a light-emitting device package according to an embodiment of the present invention.

Referring to FIG. 13, a backlight unit 1300 includes a light guide panel 1310, a light-emitting module 1320, a reflective member 1330, and a bottom cover 1340.

The light guide panel 1310 diffuses light to obtain a surface light source. The light-emitting module 1320 serves as a light source of a display device in which the backlight unit 1300 is installed, and supplies light to the light guide panel 1310. The light-emitting module 1320 includes a substrate 1322 and at least one light-emitting device package 1324. The at least one light-emitting device package 1324 may be mounted on the substrate 1322. The light-emitting device package 1324 may be a light-emitting device package according to an embodiment of the present invention.

The reflective member 1330 is formed below the light guide panel 1310, and may reflect light incident on a bottom surface of the light guide panel 1310 toward an upward direction, thereby improving the brightness of the backlight unit.

The bottom cover 1340 is configured to gather the light guide panel 1310, the light-emitting module 1320, and the reflective member 1330. To this end, the bottom cover 1340 may have a box shape of which a top surface is open, but is not limited thereto.

While the present invention has been described above with reference to exemplary embodiments, it will be apparent to those of ordinary skill in this art that various changes may be made without departing from the idea and scope of the present invention as defined in the appended claims.

REFERENCE NUMERALS

100: light-emitting device
111: substrate
120: light-emitting structure
151: support layer

The invention claimed is:

1. A light-emitting device comprising:
a substrate;
a light-emitting structure provided on the substrate, wherein the light-emitting structure comprises:
a first conductive type semiconductor layer;
a second conductive type semiconductor layer; and
an active layer provided between the first conductive type semiconductor layer and the second conductive type semiconductor layer;
a first electrode provided on the light-emitting structure;
a first connecting electrode provided on the first electrode;
a second electrode provided on the light-emitting structure;
a second connecting electrode provided on the second electrode;
a support layer provided around the first electrode, the first connecting electrode, the second electrode and the second connecting electrode;
an insulating layer provided on the support layer, and the insulating layer connected to the first electrode and the second electrode; and
a reflective electrode layer provided between the second electrode and the second conductive type semiconductor layer, and the reflective electrode layer provided between the insulating layer and the second conductive type semiconductor layer,
wherein the support layer comprises:
a first support layer having a first coefficient of thermal expansion, the first support layer made of different material than the insulating layer, the first support layer having a flat bottom surface that extends between the first connecting electrode and the second connecting electrode; and
a second support layer provided on the first support layer and having a second coefficient of thermal expansion, the second support layer having a flat top surface that extends between the first connecting electrode and the second connecting electrode,
wherein the first support layer is provided around an interface between the first electrode and the first connecting electrode and around an interface between the second electrode and the second connecting electrode, and
wherein the second coefficient of thermal expansion of the second support layer is greater than the first coefficient of thermal expansion of the first support layer, and a first thickness of the first support layer is greater than a second thickness of the second support layer,
wherein the first connecting electrode is bonded to a first lead electrode by a first bonding agent and the second connecting electrode is attached to a second lead electrode by a second bonding agent, and the second lead electrode is spaced apart from the first lead electrode, and
wherein at least one of the first bonding agent and the second bonding agent covers a part of sides of at least one of the first connecting electrode and the second connecting electrode.

2. The light-emitting device of claim 1, wherein a difference between the first coefficient of thermal expansion and the second coefficient of thermal expansion is 0.1 to 10 ppm/° C.

3. The light-emitting device of claim 2, wherein a difference between a coefficient of thermal expansion of the substrate and the first coefficient of thermal expansion is 0.1 to 5 ppm/° C.

4. The light-emitting device of claim 1,
wherein the first connecting electrode includes a top surface at the first electrode, a bottom surface opposite to the top surface, and a side surface that extends between the top surface and the bottom surface,
wherein at least one portion of the side surface of the first connecting electrode is exposed.

5. The light-emitting device of claim 4, wherein the second support layer is provided only in a region between the first connecting electrode and the second connecting electrode.

6. The light-emitting device of claim 4, wherein the second support layer is spaced apart from the side surface of the first connecting electrode and a side surface of the second connecting electrode.

7. The light-emitting device of claim 1, wherein the support layer further comprises a third support layer provided on the second support layer and having a third coefficient of thermal expansion.

8. The light-emitting device of claim 7, wherein the coefficient of thermal expansion increases from the first coefficient of thermal expansion to the second coefficient of thermal expansion to the third coefficient of thermal expansion.

9. The light-emitting device of claim 7, wherein a difference between the first coefficient of thermal expansion and the second coefficient of thermal expansion is 0.1 to 10 ppm/° C., and a difference between the second coefficient of thermal expansion and the third coefficient of thermal expansion is 0.1 to 10 ppm/° C.

10. The light-emitting device of claim 7, wherein the support layer thickness decreases from the first support layer to the second support layer to the third support layer.

11. The light-emitting device of claim 1, wherein the support layer comprises an oxide, a nitride, a fluoride, or a sulfide containing at least one selected from the group consisting of Al, Cr, Si, Ti, Zn, Zr, and B.

12. The light-emitting device of claim 1, wherein the support layer further comprises an insulating resin.

13. The light-emitting device of claim 1, wherein a coefficient of thermal expansion of the first lead electrode and the second lead electrode is greater than the second coefficient of thermal expansion of the second support layer.

14. The light-emitting device of claim 13, wherein the first coefficient of thermal expansion is about 5-10 ppm/° C., the second coefficient of thermal expansion is about 10 to 20 ppm/° C., and the coefficient of thermal expansion of the first lead electrode and the second lead electrode is about 20 ppm/° C.

15. The light-emitting device of claim 14, wherein a difference between the second coefficient of thermal expansion and the coefficient of thermal expansion of a lead frame bonded with the first connecting electrode and the second connecting electrode is 0.1 to 5 ppm/° C.

16. The light-emitting device of claim 1, wherein the insulating layer includes a first insulating layer having a first refractive index and a second insulating layer having a second refractive index different than the first refractive index.

17. A light-emitting device package comprising:
a lead frame;
a light-emitting device mounted on the lead frame; and
a molding member surrounding the light-emitting device,
wherein the light-emitting device comprises:
a substrate;
a light-emitting structure provided on the substrate, wherein the light-emitting structure comprises:
a first conductive type semiconductor layer;
a second conductive type semiconductor layer; and
an active layer provided between the first conductive type semiconductor layer and the second conductive type semiconductor layer;
a first electrode provided on the light-emitting structure;
a first connecting electrode provided on the first electrode, the first connecting electrode is bonded to the lead frame;
a second electrode provided on the light-emitting structure;
a second connecting electrode provided on the second electrode the second connecting electrode is bonded to the lead frame;
a support layer provided around the first electrode, the first connecting electrode, the second electrode and the second connecting electrode;
an insulating layer provided on the support layer, and the insulating layer connected to the first electrode and the second electrode; and
a reflective electrode layer provided between the second electrode and the second conductive type semiconductor layer, and the reflective electrode layer provided between the insulating layer and the second conductive type semiconductor layer,
wherein the support layer comprises:
a first support layer having a first coefficient of thermal expansion, the first support layer made of different material than the insulating layer, the first support layer having a flat bottom surface that extends between the first connecting electrode and the second connecting electrode; and
a second support layer provided on the first support layer and having a second coefficient of thermal expansion, the second support layer having a flat top surface that extends between the first connecting electrode and the second connecting electrode,
wherein the first support layer is provided around an interface between the first electrode and the first connecting electrode and around an interface between the second electrode and the second connecting electrode, and
wherein the second coefficient of thermal expansion of the second support layer is greater than the first coefficient of thermal expansion of the first support layer, and a coefficient of thermal expansion of the lead frame is greater than the second coefficient of thermal expansion, and a first thickness of the first support layer is greater than a second thickness of the second support layer,
wherein the first connecting electrode is bonded to a first lead electrode by a first bonding agent and the second connecting electrode is attached to a second lead electrode by a second bonding agent, and the second lead electrode is spaced apart from the first lead electrode, and
wherein at least one of the first bonding agent and the second bonding agent covers a part of sides of at least one of the first connecting electrode and the second connecting electrode.

18. The light-emitting device package of claim 17, wherein a difference between the second coefficient of thermal expansion and the coefficient of thermal expansion of the lead frame is 0.1 to 5 ppm/° C., and
wherein a difference between the first coefficient of thermal expansion and the second coefficient of thermal expansion is 0.1 to 10 ppm/° C.

19. The light-emitting device package of claim 17, wherein the first coefficient of thermal expansion is about 5-10 ppm/° C., the second coefficient of thermal expansion is about 10 to 20 ppm/° C., and the coefficient of thermal expansion of the lead frame is about 20 ppm/° C.

* * * * *